(12) United States Patent
Kim (10) Patent No.: US 11,894,219 B2
(45) Date of Patent: Feb. 6, 2024

(54) METHOD FOR PROCESSING SUBSTRATE

(71) Applicant: SEMES CO., LTD., Chungcheongnam-do (KR)

(72) Inventor: Je Ho Kim, Yongin-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/870,893

(22) Filed: Jul. 22, 2022

(65) Prior Publication Data
US 2022/0359159 A1 Nov. 10, 2022

Related U.S. Application Data (62) Division of application No. 16/367,379, filed on Mar. 28, 2019, now abandoned.

(30) Foreign Application Priority Data

Apr. 2, 2018 (KR) .................. 10-2018-0038142

(51) Int. Cl.
*H01J 37/32* (2006.01)
*H01L 21/683* (2006.01)
*H01L 21/67* (2006.01)

(52) U.S. Cl.
CPC ...... *H01J 37/3288* (2013.01); *H01J 37/3244* (2013.01); *H01J 37/32642* (2013.01); *H01J 37/32697* (2013.01); *H01J 37/32724* (2013.01); *H01L 21/67069* (2013.01); *H01L 21/67288* (2013.01); *H01L 21/6833* (2013.01); *H01J 37/3211* (2013.01); *H01J 2237/002* (2013.01); *H01J 2237/24585* (2013.01); *H01J 2237/334* (2013.01)

(58) Field of Classification Search
CPC ............... H01J 37/3288; H01J 37/3244; H01J 37/32642; H01J 37/32697; H01J 37/32724; H01J 37/3211; H01J 2237/002; H01J 2237/24585; H01J 2237/334; H01L 21/67069; H01L 21/67288; H01L 21/6833
See application file for complete search history.

(56) References Cited

U.S. PATENT DOCUMENTS

| | | | | | |
|---|---|---|---|---|---|
| 5,665,166 | A | * | 9/1997 | Deguchi | ............. C23C 16/5096 118/724 |
| 2002/0006678 | A1 | * | 1/2002 | Inazumachi | ........ H01L 21/6835 438/20 |
| 2002/0171994 | A1 | * | 11/2002 | Grimard | ........... H01L 21/67109 361/234 |

(Continued)

*Primary Examiner* — Charlee J. C. Bennett
(74) *Attorney, Agent, or Firm* — Li & Cai Intellectual Property (USA) Office (57) ABSTRACT

The inventive concept relates to an apparatus and a method for processing a substrate. In an embodiment, the apparatus includes a process chamber having a processing space inside, a support unit that supports the substrate in the processing space, a gas supply unit that supplies a process gas into the processing space, and a plasma source that generates plasma from the process gas. The support unit includes a support on which the substrate is placed, an edge ring around the substrate placed on the support, an impedance adjustment member provided below the edge ring, and a temperature adjustment member that variably adjusts temperature of the impedance adjustment member.

8 Claims, 7 Drawing Sheets

(56) References Cited

U.S. PATENT DOCUMENTS

| | | | |
|---|---|---|---|
| 2007/0224709 A1* | 9/2007 | Ogasawara | H01J 37/32642 700/121 |
| 2010/0040768 A1* | 2/2010 | Dhindsa | H01J 37/32724 427/248.1 |
| 2012/0281334 A1* | 11/2012 | Sasaki | H01J 37/32642 361/234 |
| 2017/0301578 A1* | 10/2017 | Hong | H01J 37/32862 |
| 2019/0228952 A1* | 7/2019 | Dorf | H01L 21/6833 |

* cited by examiner

METHOD FOR PROCESSING SUBSTRATE

CROSS-REFERENCE TO RELATED APPLICATIONS

This application is a divisional of U.S. patent application Ser. No. 16/367,379, filed Mar. 28, 2019, which claims for priority under 35 U.S.C. § 119 is made to Korean Patent Application No. 10-2018-0038142 filed on Apr. 2, 2018, in the Korean Intellectual Property Office, the entire contents of which are hereby incorporated by reference.

BACKGROUND

Embodiments of the inventive concept described herein relate to an apparatus for processing a substrate, and more particularly, relate to an apparatus for processing a substrate using plasma.

Plasma may be used to process a substrate. For example, plasma may be used in an etching, deposition, or dry cleaning process. Plasma is generated by heating or subjecting a neutral gas to a strong electric field or a radio frequency (RF) electromagnetic field and refers to an ionized gaseous state of matter containing ions, electrons, and radicals. A dry cleaning, ashing, or etching process using plasma is performed by allowing ions or radical particles contained in the plasma to collide with a substrate.

A substrate processing apparatus using plasma may include a chamber, a substrate support unit, and a plasma source. The substrate support unit may include an edge ring disposed to surround a substrate. The edge ring may be worn by plasma. The worn edge ring may cause non-uniform distribution of plasma incident on the substrate. The non-uniform plasma distribution may produce a result that the substrate is not processed uniformly.

SUMMARY

Embodiments of the inventive concept provide a substrate processing apparatus and method for improving processing efficiency in processing a substrate using plasma.

Embodiments of the inventive concept provide a substrate processing apparatus for uniformly controlling distribution of plasma incident on a substrate.

According to an exemplary embodiment, an apparatus for processing a substrate includes a process chamber having a processing space inside, a support unit that supports the substrate in the processing space, a gas supply unit that supplies a process gas into the processing space, and a plasma source that generates plasma from the process gas. The support unit includes a support on which the substrate is placed, an edge ring that surrounds the substrate placed on the support, an impedance adjustment member provided below the edge ring, and a temperature adjustment member that variably adjusts temperature of the impedance adjustment member.

The impedance adjustment member may be made of a material, the dielectric constant of which varies according to temperature.

The apparatus may further include a controller that controls the temperature adjustment member. The controller may control the temperature adjustment member to change the dielectric constant of the impedance adjustment member as an amount of corrosion of the edge ring increases.

The controller may control the temperature adjustment member to increase the dielectric constant of the impedance adjustment member as the amount of corrosion of the edge ring increases.

The apparatus may further include a corrosion measurement member that measures the amount of corrosion of the edge ring. The controller may receive the amount of corrosion measured by the corrosion measurement member.

The impedance adjustment member may be formed of a dielectric substance containing magnesium oxide.

The dielectric substance may contain 10 wt % to 50 wt % of magnesium oxide.

The apparatus may further include a controller that controls the temperature adjustment member. The controller may control temperature of the temperature adjustment member, based on an amount of corrosion of the edge ring.

The impedance adjustment member may have the highest dielectric constant at a first temperature, an increasing dielectric constant with a temperature rise in a range below the first temperature, and a decreasing dielectric constant with a temperature rise in a range above the first temperature. The controller may control the temperature adjustment member to raise the temperature of the impedance adjustment member in the range below the first temperature and lower the temperature of the impedance adjustment member in the range above the first temperature, when an amount of corrosion of the edge ring increases.

The impedance adjustment member may have a ring shape with an upper surface that corresponds to a shape of a lower portion of the edge ring.

According to an exemplary embodiment, a method for processing a substrate includes processing the substrate by supplying plasma onto the substrate placed on a support and controlling a plasma density above an edge ring by adjusting a dielectric constant of an impedance adjustment member that is placed below the edge ring that surrounds a side of the substrate placed on the support.

The method may further include variably adjusting the dielectric constant of the impedance adjustment member, based on an amount of corrosion of the edge ring.

The impedance adjustment member may be formed of a dielectric substance containing magnesium oxide.

The dielectric substance may contain 10 wt % to 50 wt % of magnesium oxide.

The method may further include controlling temperature to increase the dielectric constant of the impedance adjustment member as an amount of corrosion of the edge ring increases.

The impedance adjustment member may have the highest dielectric constant at a first temperature, an increasing dielectric constant with a temperature rise in a range below the first temperature, and a decreasing dielectric constant with a temperature rise in a range above the first temperature. Temperature of the impedance adjustment member may be raised in the range below the first temperature and lowered in the range above the first temperature when an amount of corrosion of the edge ring increases.

The method may further include measuring an amount of corrosion of the edge ring and changing the dielectric constant of the impedance adjustment member according to the measured amount of corrosion.

The method may further include changing the dielectric constant of the impedance adjustment member according to cumulative substrate processing time.

The method may further include changing the dielectric constant of the impedance adjustment member according to the number of substrates processed.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

A substrate processing apparatus for causing a substrate to be worn by plasma will be described in an embodiment of the inventive concept. Without being limited thereto, however, the inventive concept is applicable to various types of apparatuses for performing a process by supplying plasma into a chamber.

Figure 1:
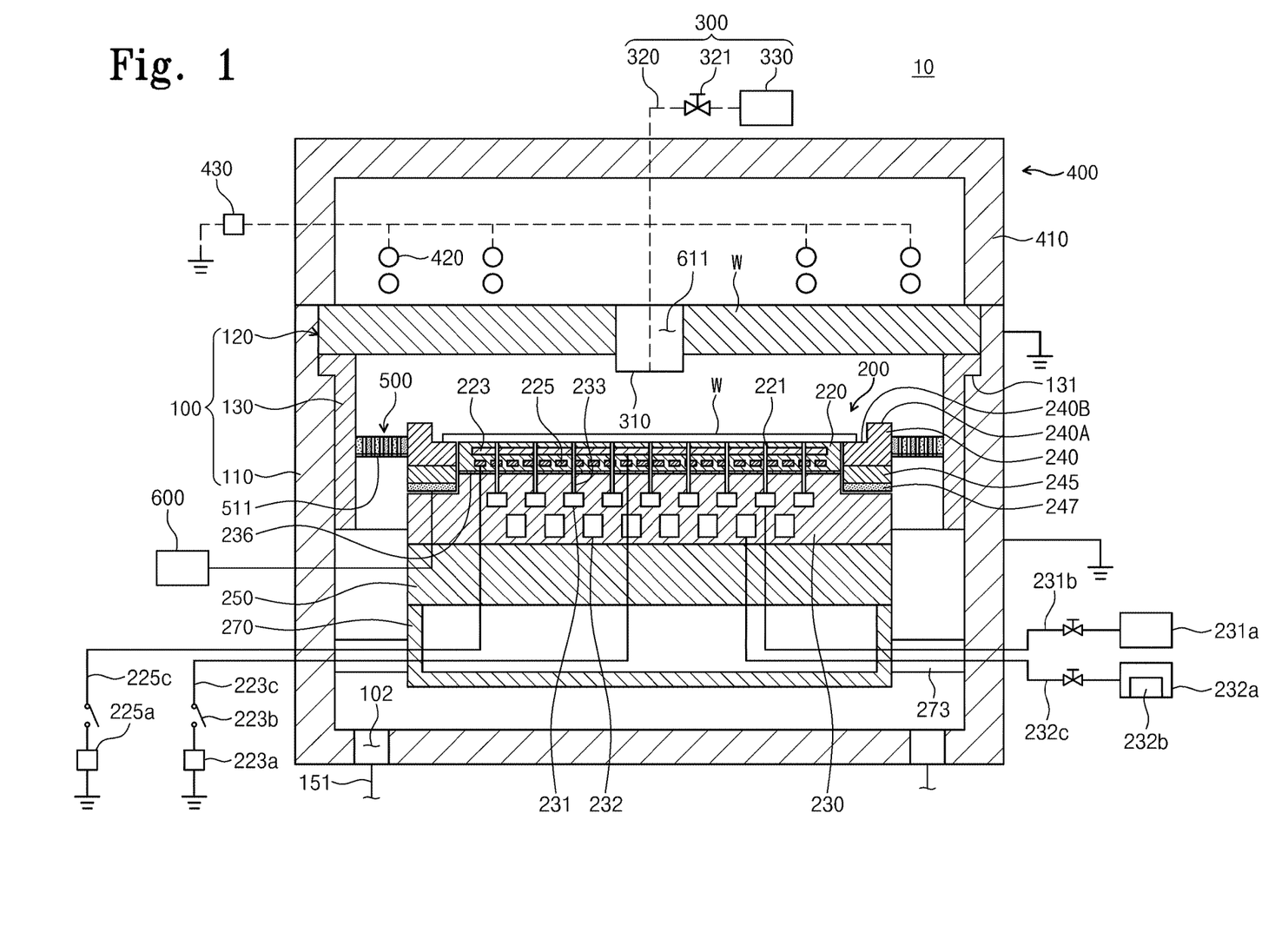
FIG. 1 is a sectional view illustrating a substrate processing apparatus according to an embodiment of the inventive concept.

FIG. 1 is a sectional view illustrating a substrate processing apparatus 10 according to an embodiment of the inventive concept.

Referring to FIG. 1, the substrate processing apparatus 10 processes a substrate W using plasma. For example, the substrate processing apparatus 10 may perform a etching process on the substrate W. The substrate processing apparatus 10 includes a chamber 100, a support unit 200, a gas supply unit 300, a plasma source 400, and an exhaust baffle 500.

The chamber 100 has a space in which substrate processing is performed. The chamber 100 includes a housing 110, a dielectric cover 120, and a liner 130.

The housing 110 is open at the top and has a processing space therein. The processing space is a space in which substrate processing is performed. The housing 110 is made of metal. The housing 110 may be made of aluminum. The housing 110 may be grounded.

The housing 110 has an exhaust hole 102 formed in the bottom thereof. The exhaust hole 102 is connected with an exhaust line 151. Reaction byproducts generated during processing and gases staying in the inner space of the housing 110 may be discharged to the outside through the exhaust line 151. The pressure inside the housing 110 is reduced to a predetermined pressure by the exhaust process.

The dielectric cover 120 covers the open top of the housing 110. The dielectric cover 120 has a plate shape and seals the inner space of the housing 110. The dielectric cover 120 may be provided so as to be removable. According to an embodiment of the inventive concept, a flow passage 611 is formed in the dielectric cover 120. Furthermore, the dielectric cover 120 may include a plurality of dielectric plates.

The liner 130 is provided inside the housing 110. The liner 130 has a space formed therein, which is open at the top and the bottom. The liner 130 may have a cylindrical shape. The liner 130 may have a radius corresponding to an inner surface of the housing 110. The liner 130 is provided along the inner surface of the housing 110. A support ring 131 is formed at the top of the liner 130. The support ring 131 is implemented with a plate in a ring shape and protrudes outside the liner 130 along the periphery of the liner 130. The support ring 131 is placed on an upper end of the housing 110 and supports the liner 130. The liner 130 may be made of the same material as that of the housing 110. The liner 130 may be made of aluminum. The liner 130 protects the inner surface of the housing 110.

The support unit 200 is located in the processing space of the chamber 100. The support unit 200 supports the substrate W. The support unit 200 may include an electrostatic chuck that electro-statically clamps the substrate W using electrostatic force. Alternatively, the support unit 200 may support the substrate W by various methods such as mechanical clamping. Hereinafter, the support unit 200 including the electrostatic chuck will be described.

The support unit 200 includes the electrostatic chuck, an insulating plate 250, and a lower cover 270. The support unit 200 is located in the chamber 100 and is spaced apart upward from the bottom of the housing 110.

The electrostatic chuck includes a dielectric plate 220, a chucking electrode 223, a heater 225, a support plate 230, an edge ring 240, and an impedance adjustment member 245. The present embodiment is described in which the electrostatic chuck includes the edge ring 240 and the impedance adjusting member 245. However, the edge ring 240 and the impedance adjusting member 245 may be separated from the electrostatic chuck.

The dielectric plate 220 is located at the top of the electrostatic chuck. The dielectric plate 220 is formed of a dielectric substance in a disk shape. The substrate W is placed on the top side of the dielectric plate 220.

The dielectric plate 220 has first supply passages 221 formed therein. The first supply passages 221 extend from the top side to the bottom side of the dielectric plate. The first supply passages 221 are spaced apart from each other and serve as passages through which a heat transfer medium is supplied to the bottom side of the substrate W.

The chucking electrode 223 and the heater 225 are buried in the dielectric plate 220. The chucking electrode 223 is located above the heater 225. The chucking electrode 223 is electrically connected to a first lower power supply 223a. The first lower power supply 223a includes a direct current (DC) power supply.

A switch 223b is installed between the chucking electrode 223 and the first lower power supply 223a. The chucking electrode 223 may be electrically connected to, or disconnected from, the first lower power supply 223a by turning on/off the switch 223b. When the switch 223b is turned on, DC current is applied to the chucking electrode 223. The current applied to the chucking electrode 223 induces electrostatic force between the chucking electrode 223 and the substrate W, and the substrate W is clamped to the dielectric plate 220 by the electrostatic force.

The heater 225 is electrically connected to a second lower power supply 225a. The heater 225 generates heat by resisting current applied by the second lower power supply 225a. The generated heat is transferred to the substrate W through the dielectric plate 220. The substrate W is maintained at a predetermined temperature by the heat generated from the heater 225. The heater 225 includes a spiral coil.

The support plate 230 is located below the dielectric plate 220. The bottom side of the dielectric plate 220 and the top side of the support plate 230 may be bonded by an adhesive 236. The support plate 230 may be made of aluminum. The top side of the support plate 230 may have a step such that the central region of the top side is located in a higher position than the edge region of the top side. The central region of the top side of the support plate 230 has an area corresponding to the bottom side of the dielectric plate 220 and is bonded to the bottom side of the dielectric plate 220. The support plate 230 has a first circulation passage 231, a second circulation passage 232, and second supply passages 233 formed therein.

The first circulation passage 231 serves as a passage through which the heat transfer medium circulates. The first circulation passage 231 may be formed in a spiral shape in the support plate 230. Alternatively, the first circulation passage 231 may include a plurality of concentric annular passages having different radii. The first circulation passages 231 may be connected together. The first circulation passages 231 are formed at the same height.

The second circulation passage 232 serves as a passage through which cooling fluid circulates. The second circulation passage 232 may be formed in a spiral shape in the support plate 230. Alternatively, the second circulation passage 232 may include a plurality of concentric annular passages having different radii. The second circulation passages 232 may be connected together. The second circulation passages 232 may have a larger cross-sectional area than the first circulation passages 231. The second circulation passages 232 are formed at the same height. The second circulation passages 232 may be located below the first circulation passages 231.

The second supply passages 233 extend upward from the first circulation passages 231 to the top side of the support plate 230. As many second supply passages 233 as the first supply passages 221 are formed. The second supply passages 233 connect the first circulation passages 231 and the first supply passages 221.

The first circulation passages 231 are connected to heat transfer medium storage 231a through a heat transfer medium supply line 231b. The heat transfer medium storage 231a has a heat transfer medium stored therein. The heat transfer medium includes an inert gas. According to an embodiment, the heat transfer medium includes helium (He) gas. The helium gas is supplied to the first circulation passages 231 through the heat transfer medium supply line 231b and then supplied to the bottom side of the substrate W via the second supply passages 233 and the first supply passages 221 in a serial order. The helium gas serves as a medium through which heat transferred from plasma to the substrate W is transferred to the electrostatic chuck.

The second circulation passages 232 are connected to cooling fluid storage 232a through a cooling fluid supply line 232c. The cooling fluid storage 232a has cooling fluid stored therein. The cooling fluid storage 232a may include a cooler 232b therein. The cooler 232b cools the cooling fluid to a predetermined temperature. Alternatively, the cooler 232b may be mounted on the cooling fluid supply line 232c. The cooling fluid supplied to the second circulation passages 232 through the cooling fluid supply line 232c cools the support plate 230 while circulating through the second circulation passages 232. The support plate 230, while being cooled, cools the dielectric plate 220 and the substrate W together to maintain the substrate W at a predetermined temperature.

The edge ring 240 is disposed at the edge of the electrostatic chuck. The edge ring 240 has a ring shape and is disposed around the dielectric plate 220. The top side of the edge ring 240 may have a step such that an outer portion 240a of the top side is located in a higher position than an inner portion 240b of the top side. The inner portion 240b of the top side of the edge ring 240 is flush with the top side of the dielectric plate 220.

The edge ring 240 surrounds the edge of the substrate W located on the top side of the dielectric plate 220. The edge ring 240 allows plasma in the chamber 100 to be concentrated on a region that faces the substrate W.

The impedance adjustment member 245 is disposed below the edge ring 240. The impedance adjustment member 245 has a ring shape, the top side of which corresponds to the shape of the bottom of the edge ring 240. The impedance adjustment member 245 is formed of a dielectric substance, the dielectric constant of which varies according to temperature. The impedance adjustment member 245 is made of a material that has a large variation in dielectric constant according to a temperature change.

A temperature adjustment member 247 is mounted on the impedance adjustment member 245. The temperature adjustment member 247 is connected to a controller 600. The temperature adjustment member 247 adjusts the temperature of the impedance adjustment member 245 to vary the dielectric constant thereof, thereby adjusting impedance.

The insulating plate 250 is located below the support plate 230. The insulating plate 250 has a cross-sectional area corresponding to that of the support plate 230. The insulating plate 250 is located between the support plate 230 and the lower cover 270. The insulating plate 250 is made of an insulating material and electrically insulates the support plate 230 from the lower cover 270.

The lower cover 270 is located at the bottom of the support unit 200. The lower cover 270 is spaced apart upward from the bottom of the housing 110. The lower cover 270 has a space formed therein, which is open at the top. The top side of the lower cover 270 is covered with the insulating plate 250. Accordingly, the outer diameter of the cross-section of the lower cover 270 may be the same as the outer diameter of the insulating plate 250. The lower cover 270 has an inner space in which to accommodate a lift pin module (not illustrated) that moves the transferred substrate W from an external transfer member to the electrostatic chuck.

The lower cover 270 has connecting members 273. The connecting members 273 connect the outer surface of the lower cover 270 and the inner wall of the housing 110. The connecting members 273 may be provided on the outer surface of the lower cover 270 at predetermined intervals. The connecting members 273 support the support unit 200 inside the chamber 100. Furthermore, the connecting members 273 are connected to the inner wall of the housing 110 to allow the lower cover 270 to be electrically grounded. A first power line 223c connected to the first lower power supply 223a, a second power line 225c connected to the second lower power supply 225a, the heat transfer medium supply line 231b connected to the heat transfer medium storage 231a, and the cooling fluid supply line 232c connected to the cooling fluid storage 232a extend into the lower cover 270 through inner spaces of the connecting members 273.

The gas supply unit 300 supplies a process gas into the processing space of the chamber 100. The gas supply unit 300 includes a gas supply nozzle 310, a gas supply line 320, and gas storage 330. The gas supply nozzle 310 is inserted through the central portion of the dielectric cover 120. The gas supply nozzle 310 has an injection hole formed in the bottom thereof. The injection hole is located below the dielectric cover 120 and supplies the process gas into the processing space of the chamber 100. The gas supply line 320 connects the gas supply nozzle 310 and the gas storage 330. The gas supply line 320 is used to supply the process gas stored in the gas storage 330 to the gas supply nozzle 310. A valve 321 is installed in the gas supply line 320. The valve 321 opens or closes the gas supply line 320 and adjusts the flow rate of the process gas that is supplied through the gas supply line 320.

The plasma source 400 excites the process gas supplied into the processing space of the chamber 100 into plasma. An inductively coupled plasma (ICP) source may be used as the plasma source 400. The plasma source 400 includes an antenna seal 410, an antenna 420, and a plasma power supply 430. The antenna seal 410 has a cylindrical shape that is open at the bottom. The antenna seal 410 has a space therein. The antenna seal 410 has a diameter corresponding to that of the chamber 100. A lower end of the antenna seal 410 is attachable to and detachable from the dielectric cover 120. The antenna 420 is disposed inside the antenna seal 410. The antenna 420 has a spiral coil shape wound a plurality of times and is connected to the plasma power supply 430. The antenna 420 receives electric power from the plasma power supply 430. The plasma power supply 430 may be located outside the chamber 100. The antenna 420, to which the electric power is applied, may form an electromagnetic field in the processing space of the chamber 100. The process gas is excited into plasma by the electromagnetic field.

The exhaust baffle 500 is located between the inner wall of the housing 110 and the support unit 200. The exhaust baffle 500 has through-holes 511 formed therein. The exhaust baffle 500 has an annular ring shape. The process gas supplied into the housing 110 passes through the through-holes 511 of the exhaust baffle 500 and is discharged through the exhaust hole 102. The flow of the process gas may be controlled depending on the shape of the exhaust baffle 500 and the shape of the through-holes 511.

Hereinafter, the edge ring 240 and the impedance adjustment member 245 of the substrate processing apparatus 10 according to an embodiment of the inventive concept will be described.

Figure 2:
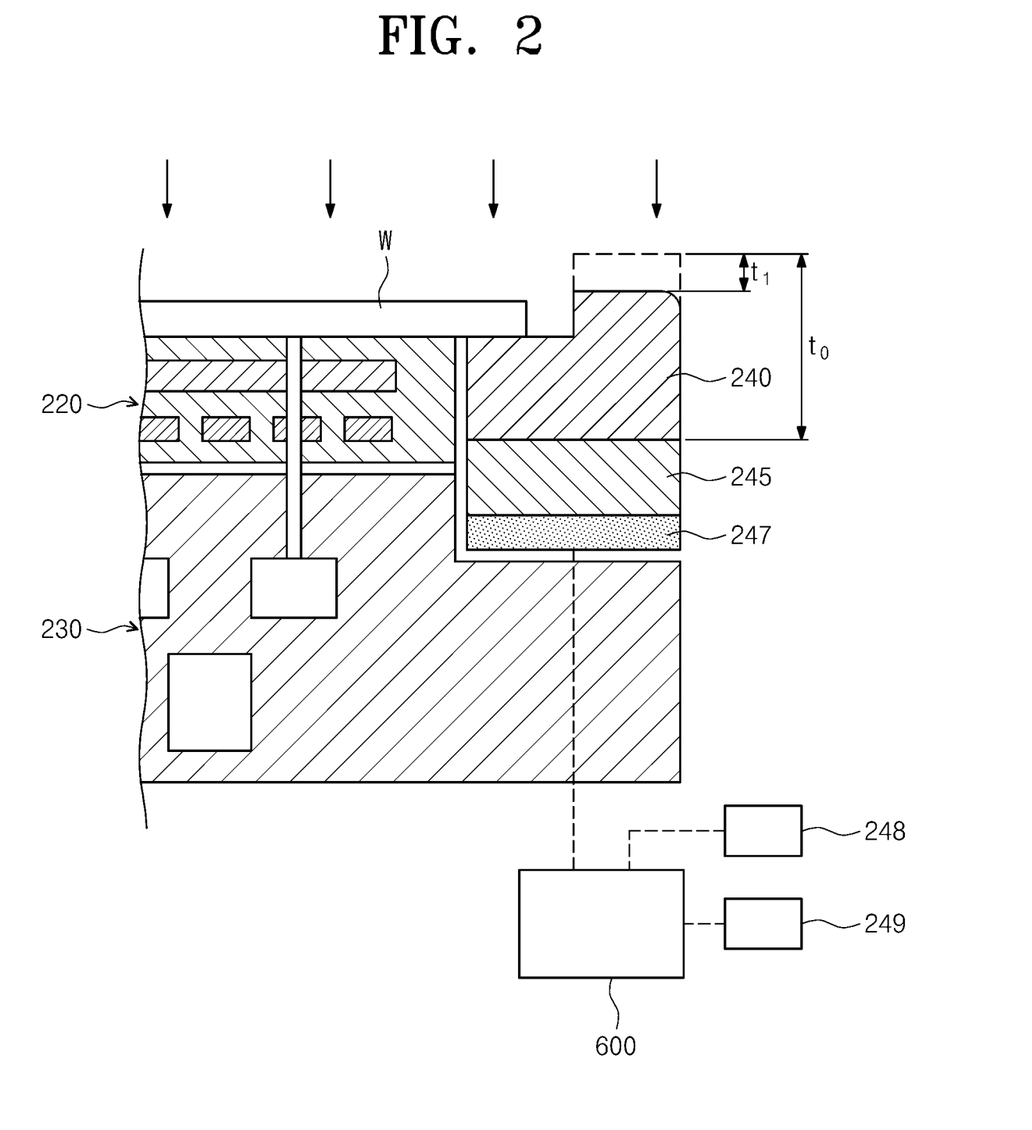
FIGS. 2 and 3 are enlarged views illustrating corrosion states caused by use of an edge ring according to an embodiment of the inventive concept.
Figure 3:
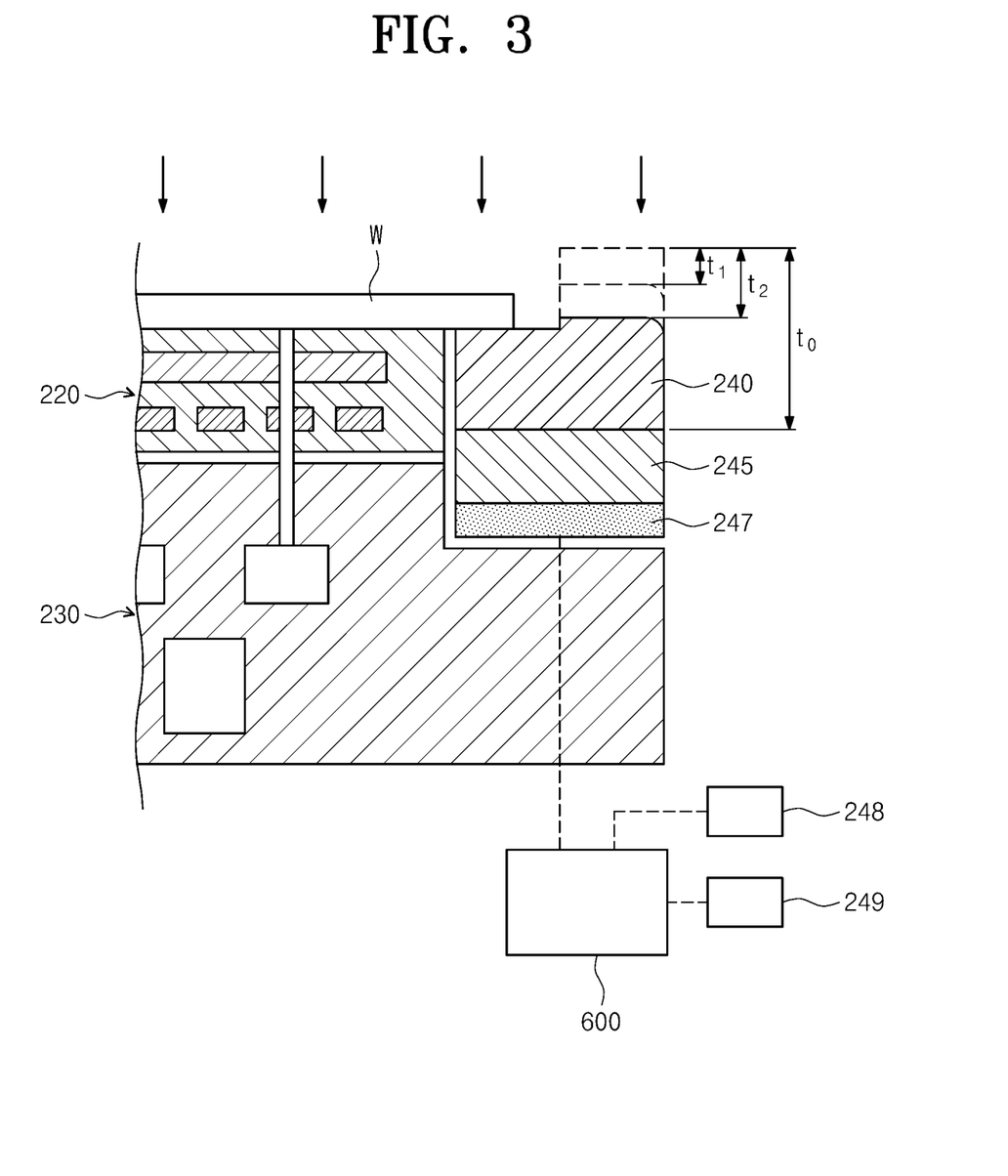

FIGS. 2 and 3 are enlarged views illustrating corrosion states caused by use of the edge ring according to an embodiment of the inventive concept.

Referring to FIG. 2, the edge ring 240 has an initial thickness of $T_0$. The top side of the edge ring 240 is worn by a first thickness of $T_1$ by plasma generated from the process gas. Referring to FIG. 3, the edge ring 240 is worn by a second thickness of $T_2$ by plasma.

As illustrated in FIGS. 2 and 3, the thickness of the edge ring 240 and the shape of an upper surface thereof are changed due to the exposure to plasma. When the thickness and shape of the edge ring 240 are changed by the corrosion, the thickness of a sheath on the top side of the edge ring 240 is also changed according to the change in the thickness and shape of the edge ring 240. Hence, a tilting phenomenon may arise in which ions are obliquely incident on the edge of the substrate W and the resultant hole is formed to be obliquely inclined. The tilting phenomenon may cause a reduction in yield. In an effort to manage the tilting phenomenon, a maintenance process may be added to recover the apparatus to the original state. However, substrates cannot be processed at all during the maintenance of the apparatus, which leads to reduced productivity.

The temperature adjustment member 247 and a corrosion measurement member 248 are connected to the controller 600.

The controller 600 controls the temperature adjustment member 247 to adjust the temperature of the impedance adjustment member 245. For example, the temperature adjustment member 247 may be a heater. The controller 600 feeds back the temperature of the impedance adjustment member 245, based on temperature information received from the corrosion measurement member 248. The controller 600 may adjust the temperature of the impedance adjustment member 245 to a temperature at which a target impedance is able to be obtained, by controlling the temperature adjustment member 247, based on the information received from the corrosion measurement member 248.

The corrosion measurement member 248 may be a distance measurement sensor installed outside the impedance adjustment member 245. The distance measurement sensor may measure an amount of corrosion by a method of measuring a change in the height of the impedance adjustment member 245. Although the corrosion measurement member 248 is illustrated as being installed outside the impedance adjustment member 245, the corrosion measurement member 248 may be an electric field intensity measurement device or a temperature measurement device that is installed inside the impedance measurement member 245.

The amount of corrosion of the edge ring 240 represents the height of the edge ring 240 after corrosion relative to the initial height thereof. The amount of corrosion of the edge ring 240 may be calculated by various ways such as Equation 1: (the height of the edge ring 240 after corrosion)/(the initial height of the edge ring 240), Equation 2: (the volume of the edge ring 240 after corrosion)/(the initial volume of the edge ring 240), Equation 3: (the intensity of an electric field after corrosion)/(the intensity of an initial electric field), Equation 4: (the height of the edge ring 240 after corrosion)−(the initial height of the edge ring 240), Equation 5: (the volume of the edge ring 240 after corrosion)−(the initial volume of the edge ring 240), Equation 6: (the intensity of an electric field after corrosion)−(the intensity of an initial electric field), and the like.

The controller 600 may be connected with a memory 249. The memory 249 has an amount of corrosion parameter input thereto. The amount of corrosion parameter may be an average amount of corrosion parameter of the edge ring 240 according to cumulative processing time or an average amount of corrosion parameter of the edge ring 240 according to the number of substrates processed. The controller 600 adjusts the dielectric constant of the impedance adjustment member 245, based on data received from the memory 249.

The corrosion measurement member 248 and the memory 249 are means for obtaining the amount of corrosion of the edge ring 240. Only one of them may be provided, or both of them may be provided to complement each other.

Figure 4:
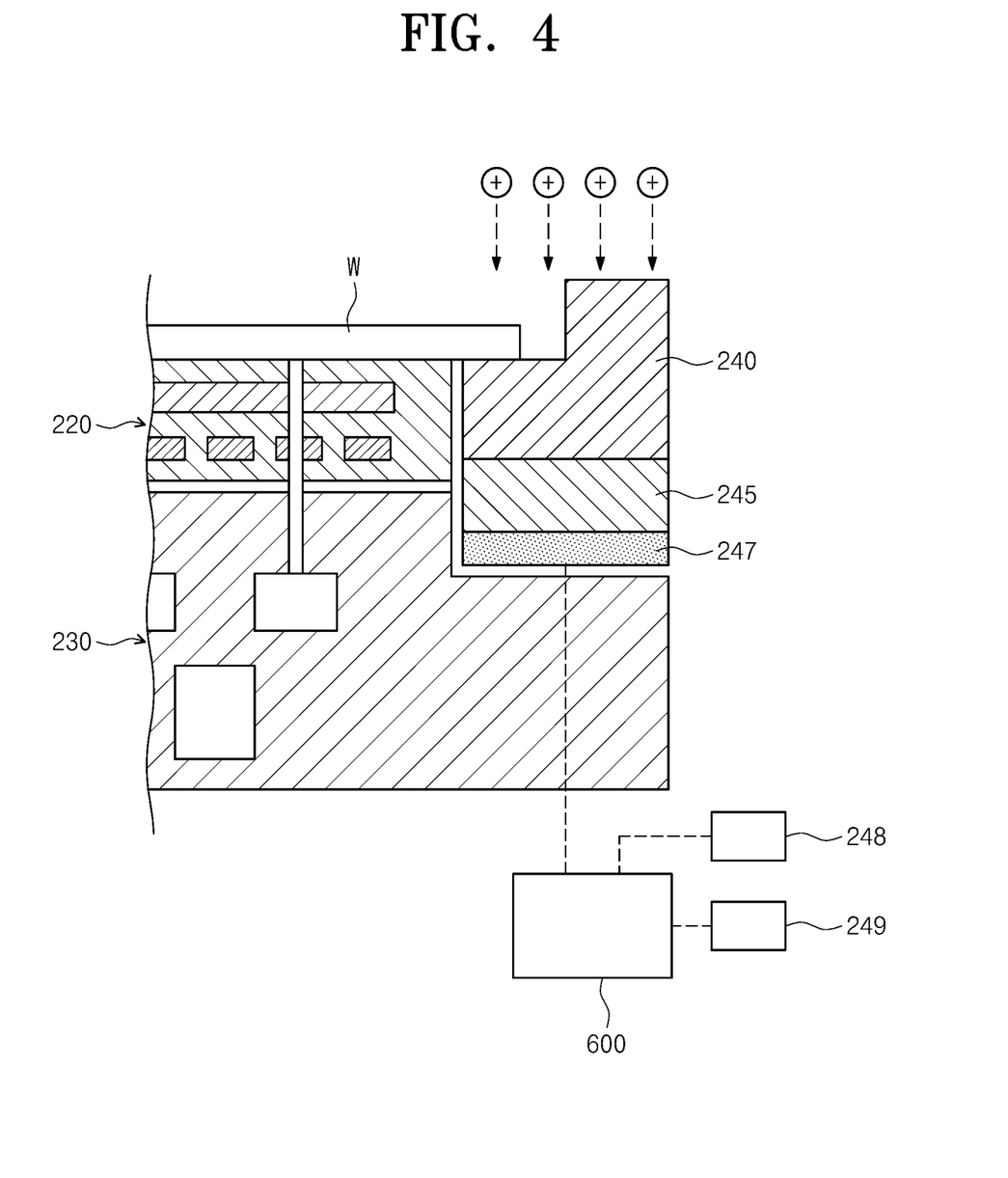
FIGS. 4 and 5 are enlarged views illustrating the behavior of plasma near the edge ring of a support unit according to an embodiment of the inventive concept.
Figure 5:
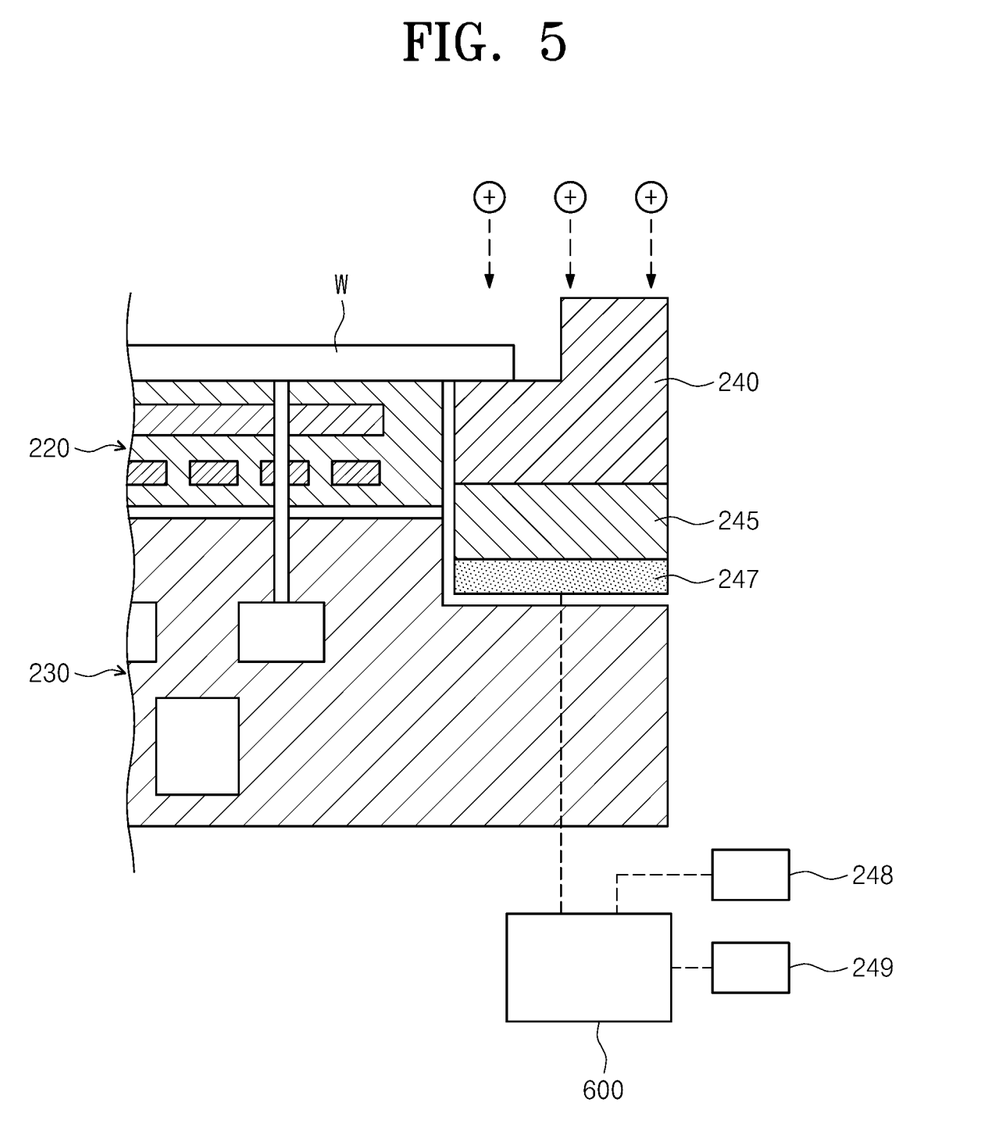

FIGS. 4 and 5 are enlarged views illustrating the behavior of plasma near the edge ring of the support unit according to an embodiment of the inventive concept. In FIGS. 4 and 5, the intensity of an electric field is represented by the number of positive ions.

Referring to FIG. 4, the dielectric constant of the impedance adjustment member 245 varies according to temperature. Therefore, the intensity of the electric field may be increased by decreasing the dielectric constant as illustrated in FIG. 4, or may be decreased by increasing the dielectric constant as illustrated in FIG. 5. Accordingly, the amount of plasma incident on the edge of the substrate W may be maintained at a predetermined level by actively changing the intensity of the electric field in response to a change in the thickness of the edge ring 240 and the shape of the upper surface thereof due to exposure to the plasma.

For example, the dielectric constant of the impedance adjustment member 245 may be controlled to increase with an increase in the amount of corrosion of the edge ring 240, and thus the amount of plasma incident on the edge of the substrate W may be maintained at the predetermined level.

Figure 6:
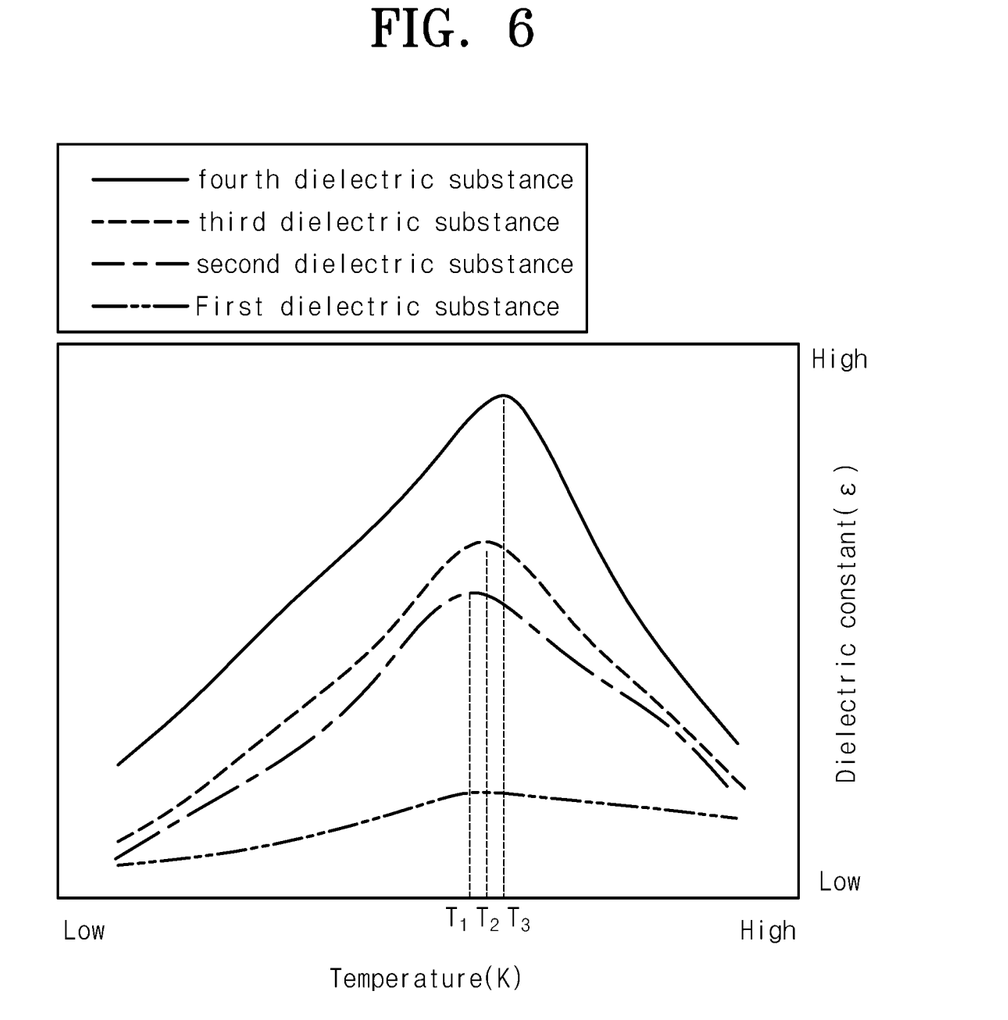
FIG. 6 is a graph of dielectric constant versus temperature for dielectric substances according to an embodiment of the inventive concept.

FIG. 6 is a graph of dielectric constant versus temperature for dielectric substances according to an embodiment of the inventive concept.

Referring to FIG. 6, the graph depicts variations in dielectric constants of first to fourth dielectric substances according to temperature. The variations in the dielectric constants according to temperature increase from the first dielectric substance to the fourth dielectric substance.

The first and second dielectric substances have the highest dielectric constants at a temperature of $T_1$. The dielectric constants of the first and second dielectric substances gradually decrease with a temperature drop in the temperature range below $T_1$ and gradually decrease with a temperature rise in the temperature range above $T_1$.

The third dielectric substance has the highest dielectric constant at a temperature of $T_2$. The temperature $T_2$ is higher than the temperature $T_1$. The dielectric constant of the third dielectric substance gradually decreases with a temperature drop in the temperature range below $T_2$ and gradually decreases with a temperature rise in the temperature range above $T_2$.

The fourth dielectric substance has the highest dielectric constant at a temperature of $T_3$. The temperature $T_3$ is higher than the temperature $T_2$. The dielectric constant of the fourth dielectric substance gradually decreases with a temperature drop in the temperature range below $T_3$ and gradually decreases with a temperature rise in the temperature range above $T_3$.

The first dielectric substance has a narrow variable impedance range because the variation in the dielectric constant according to temperature is small, and the second to fourth dielectric substances have wide variable impedance ranges because the variations in the dielectric constants according to temperature are large.

The second dielectric substance is a dielectric substance containing 10 wt % to 20 wt % of magnesium oxide (MgO), the third dielectric substance is a dielectric substance containing 20 wt % to 35 wt % of magnesium oxide (MgO), and the fourth dielectric substance is a dielectric substance containing 35 wt % to 50 wt % of magnesium oxide (MgO). A dielectric substance that has a large variation in dielectric constant according to temperature is also applicable, in addition to the dielectric substances containing magnesium oxide.

Figure 7:
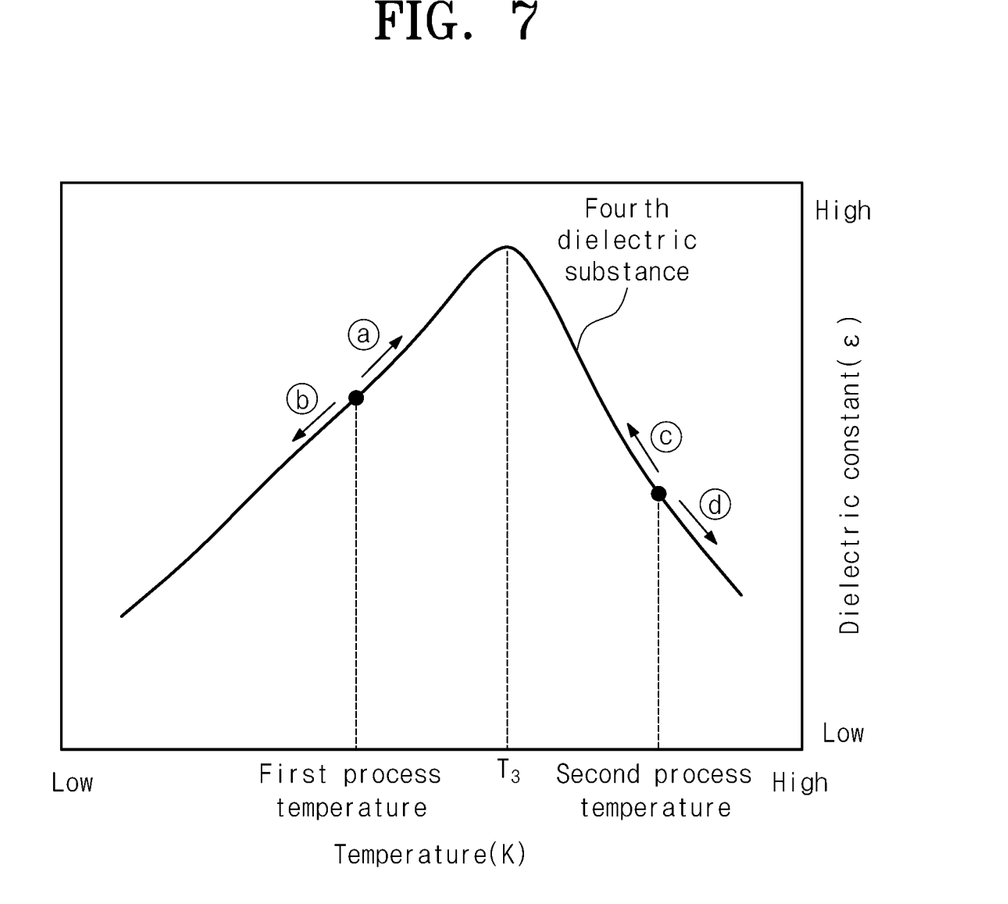
FIG. 7 is a graph of dielectric constant versus temperature for a fourth dielectric substance according to an embodiment of the inventive concept.

FIG. 7 is a graph of dielectric constant versus temperature for the fourth dielectric substance according to an embodiment of the inventive concept.

Referring to FIG. 7, the fourth dielectric substance has the highest dielectric constant at the temperature of $T_3$. If a specific process is performed at a first process temperature, the temperature of the temperature adjustment member 247 is raised (direction a) to increase the dielectric constant and is lowered (direction b) to decrease the dielectric constant.

If a specific process is performed at a second process temperature, the temperature of the temperature adjustment member 247 is lowered (direction c) to increase the dielectric constant and is raised (direction d) to decrease the dielectric constant.

According to the embodiments of the inventive concept, the substrate processing apparatus and method may improve substrate processing efficiency in processing a substrate using plasma.

In addition, according to the embodiments of the inventive concept, the substrate processing apparatus and method may uniformly control distribution of plasma incident on a substrate.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for processing a substrate, the method comprising:
    processing the substrate by supplying plasma onto the substrate placed on a support; and
    controlling a plasma density above an edge ring by adjusting a dielectric constant of a dielectric substance with ring shape placed below the edge ring, the edge ring being configured to surround a side of the substrate placed on the support,
    wherein the dielectric substance with ring shape has a highest dielectric constant at a first temperature, an increasing dielectric constant with a temperature rise in a range below the first temperature, and a decreasing dielectric constant with a temperature rise in a range above the first temperature, and
    wherein temperature of the dielectric substance with ring shape is raised in the range below the first temperature and lowered in the range above the first temperature when an amount of corrosion of the edge ring increases.

2. The method of claim 1, further comprising:
    variably adjusting the dielectric constant of the dielectric substance with ring shape, based on the amount of corrosion of the edge ring.

3. The method of claim 1, wherein the dielectric substance with ring shape is formed of a dielectric substance containing magnesium oxide.

4. The method of claim 3, wherein the dielectric substance contains 10 wt % to 50 wt % of magnesium oxide.

5. The method of claim 1, further comprising:
    controlling temperature to increase the dielectric constant of the dielectric substance with ring shape as the amount of corrosion of the edge ring increases.

6. The method of claim 1, further comprising:
    measuring the amount of corrosion of the edge ring; and
    changing the dielectric constant of the dielectric substance with ring shape according to the measured amount of corrosion.

7. The method of claim 1, further comprising:
    changing the dielectric constant of the dielectric substance with ring shape according to cumulative substrate processing time.

8. The method of claim 1, further comprising:
changing the dielectric constant of the dielectric substance with ring shape according to a number of substrates processed.

* * * * *